(12) United States Patent
Farrar

(10) Patent No.: US 6,740,392 B1
(45) Date of Patent: May 25, 2004

(54) SURFACE BARRIERS FOR COPPER AND SILVER INTERCONNECTS PRODUCED BY A DAMASCENE PROCESS

(75) Inventor: Paul A. Farrar, Bluffton, SC (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/414,147

(22) Filed: Apr. 15, 2003

(51) Int. Cl.$^7$ ................................................ H01L 29/04
(52) U.S. Cl. ........................ 428/209; 428/210; 428/446; 428/701; 428/702
(58) Field of Search ................................. 428/209, 210, 428/446, 701, 702

(56) References Cited

U.S. PATENT DOCUMENTS

| | | |
|---|---|---|
| 2,842,438 A | 7/1958 | Saarivirta et al. |
| 5,130,274 A | 7/1992 | Harper et al. |
| 6,077,792 A | 6/2000 | Farrar |
| 6,307,266 B1 * | 10/2001 | Yung ........................... 257/758 |
| 6,352,917 B1 * | 3/2002 | Gupta et al. ................ 438/622 |
| 6,376,370 B1 | 4/2002 | Farrar |
| 6,420,262 B1 | 7/2002 | Farrar |
| 6,426,289 B1 | 7/2002 | Farrar |

OTHER PUBLICATIONS

Andricacos, Panos C., "Copper On–Chip Interconnections", The Electrochemical Society Interface, Spring 1999, pp. 32–37, vol. 8, No. 1.

Braud et al., "Ultra Thin Diffusion Barriers for Cu Interconnections at the Gigabit Generation and Beyond", VMIC Conference, Jun. 1996, pp. 174–179, 1996 ISMIC—106/96/0174(c).

de Felipe et al., "Electrical Stability and Microstructural Evolution in Thin Films of High Conductivity Copper Allows", IEEE, 1999, IITC 99/293–295.

Ding et al., "Copper Barrier, Seed Layer and Planarization Technologies", VMIC Conference, Jun. 1997, pp. 87–92, 1997 ISMIC—107/97/0087(c).

(List continued on next page.)

*Primary Examiner*—Deborah Jones
*Assistant Examiner*—Vivek Koppikar
(74) *Attorney, Agent, or Firm*—TraskBritt

(57) ABSTRACT

A semiconductor device structure having a barrier layer comprising a conductive portion and a nonconductive portion is disclosed. The conductive portion includes a metal nitride compound and the nonconductive portion includes a metal oxide, metal oxynitride, metal carbide, or metal carbonitride compound. A method of forming the semiconductor device structure is also disclosed. The method comprises forming a barrier layer over a metallization layer and a dielectric layer in the semiconductor device structure. The barrier layer is formed by depositing a thin, metal layer over the metallization layer and the dielectric layer. The metal layer is exposed to a nitrogen atmosphere and the nitrogen reacts with portions of the metal layer over the metallization layer to form a conductive, metal nitride portion of the barrier layer. Portions of the metal layer over the dielectric layer react with carbon or oxygen in the dielectric layer to produce a nonconductive portion of the barrier layer.

37 Claims, 6 Drawing Sheets

OTHER PUBLICATIONS

Godbey et al., "Copper Diffusion in Organic Polymer Resists and Inter–Level Dielectrics", Thin Solid Films, Oct. 31, 1997, pp. 470–474, vols. 308–309.

Iijima et al. "Structure and Electrical Properties of Amorphous W–Si–N Barrier Layer for Cu Interconnections", VMIC Conference, Jun. 1996, pp. 168–173, 1996 ISMIC—106/96/0168(c).

"International Conference on Metallurgical Coatings and Thin Films", Program and Abstracts, Apr. 1997, pp. 309, 313.

"Improved Metallurgy for Wiring Very Large Scale Integrated Circuits", International Technology Disclosures, Sep. 25, 1986, 1 page, vol. 4, No. 9.

Lyman et al., "Metallography, Structures and Phase Diagrams", Metals Handbook, 8$^{th}$ Edition, date unknown, pp. 300–302, vol. 8, Metals Park, Ohio.

Marcadal et al., "OMCVD Copper Process for Dual Damascene Metallization", VMIC Conference, Jun. 1997, pp. 93–98, 1997 ISMIC—107/97/0093(c).

Murarka et al., "Copper Interconnection Schemes: Elimination of the Need of Diffusion Barrier/Adhesion Propoter by the Use of Corrosion Resistant, Low Resistivity Doped Copper", SPIE, Jan. 1994, pp. 80–90, vol. 2335.

Ryu et al., "Barriers for Copper Interconnections", Solid State Technology, Apr. 1999, pp. 1–6, vol. 42, Issue 4, p53.

Saarivirta, Matti J., "High Conductivity Copper–Rich Cu–Zr Alloys", Transactions of the Metallurgical Society of AIME, Jun. 1960, pp. 431–437, vol. 218, New York, NY.

* cited by examiner

US 6,740,392 B1

SURFACE BARRIERS FOR COPPER AND SILVER INTERCONNECTS PRODUCED BY A DAMASCENE PROCESS

BACKGROUND OF THE INVENTION

1. Field of the Invention

The present invention relates to a method of fabricating a barrier layer and, more particularly, to a method of fabricating a barrier layer on a top surface of metal in damascene structures utilizing ion implantation.

2. State of the Art

One of the main problems confronting the semiconductor processing industry, in the ultra large scale integration ("ULSI") age, is that of capacitive-resistance loss in wiring levels. This has led to a large effort to reduce the resistance of, and lower the capacitive loading on, the wiring levels. Since its beginning, the industry has relied on aluminum and aluminum alloys in metallization layers. To improve conductivity in the wiring, it has been proposed that copper metallurgy be substituted for the aluminum metallurgy. However, several problems have been encountered in the development of the copper metallurgy. One of the main problems is the fast diffusion of copper through insulative materials, such as silicon and silicon dioxide ("$SiO_2$"), to form an undesired copper oxide compound. In addition, copper is known to cause junction poisoning effects. These problems have led to the development of a liner to separate the copper metallurgy used in the metallization layer from the insulative material. However, copper does not adhere well to oxygen-containing dielectric materials or to itself. Therefore, the liner functions as both an adhesion layer and a barrier layer. In other words, the liner is used to provide adhesion between the copper metallurgy and the insulative material and also to prevent the diffusion of copper through the insulative material.

Liner materials that act as a barrier layer to prevent the diffusion of copper have been investigated by numerous researchers. The use of titanium ("Ti"), zirconium ("Zr"), or hafnium ("Hf") in the barrier layer has been disclosed. Anonymous, "Improved Metallurgy for Wiring Very Large Scale Integrated Circuits," International Technology Disclosures, v. 4 no. 9, (Sep. 25, 1986). Chemical vapor deposition ("CVD") of titanium nitride ("TiN") has also been proposed. C. Marcadal et al., "OMCVD Copper Process for Dual Damascene Metallization," VMIC Conference Proceedings, p. 93–98 (1997). It is currently believed that an optimal liner material for a barrier layer is either a metal, such as tantalum ("Ta") or tungsten ("W"), or a compound such as tantalum nitride ("TaN") or trisilicon tetranitride ("$Si_3N_4$"). Changsup Ryu et al., "Barriers for Copper Interconnections." Solid State Technology, p. 53–56 (1999).

Researchers have also proposed an alternate method of forming the barrier layer where the copper of the metallization layer is alloyed with a reactive element, such as aluminum or magnesium. S. P. Muraka et al., "Copper Interconnection Schemes: Elimination of the Need of Diffusion Barrier/Adhesion Promoter by the Use of Corrosion Resistant, Low Resistivity Doped Copper," SPIE, v. 2335, p. 80–90 (1994) (hereinafter "Muraka"); Tarek Suwwan de Felipe et al., "Electrical Stability and Microstructural Evolution in Thin Films of High Conductivity Copper Alloys," Proceedings of the 1999 International Interconnect Technology Conference, p. 293–295 (1999). Copper alloys with 0.5 atomic percent aluminum or 2 atomic percent magnesium were used. The reactive element reacted with $SiO_2$ to form dialuminum trioxide ("$Al_2O_3$") or magnesium oxide ("MgO"), which acted as a barrier to the further diffusion of the copper into the $Sio_2$.

Similarly, in U.S. Pat. No. 5,130,274 issued to Harper et al. (hereinafter "Harper"), an oxide layer that acts as a barrier is disclosed. To form the barrier, a copper alloy containing an alloying element, such as aluminum or chromium, is deposited as a layer. The alloying element reacts with $SiO_2$ or a polyimide to form an oxide that functions as a barrier compound.

Semiconductor products that incorporate some of these solutions to the problem of copper diffusion have begun to ship, on a limited basis. However, a problem of how to achieve the lowest possible resistivity in ever smaller lines still remains. As shown in Panos C. Andricacos, "Copper On-Chip Interconnections," The Electrochemical Society Interface, p. 32–37 (Spring 1999) (hereinafter "Andricacos"), the effective resistivity obtainable by use of barrier layers was approximately $2\mu\Omega$-cm with a line width greater than 0.3 $\mu$m. The effective resistivity undesirably increases for narrower lines. The alloys investigated by Muraka had similar resistivity values to those found by Andricacos. Muraka also found that the use of 0.5 atomic percent aluminum in the copper was apparently insufficient to provide complete protection from copper diffusion into the $SiO_2$. However, a significant reduction in the rate of copper penetration through the $SiO_2$ was achieved. The maximum solubility of aluminum in copper is 9.4 weight percent or approximately 18 atomic percent and the maximum solubility of magnesium in copper is 0.61 weight percent or approximately 0.3 atomic percent. Thus, the alloys investigated in Muraka were saturated with magnesium but were far below the saturation limit when aluminum was used as the reactive element.

Other researchers have investigated the capacitive loading effect with various polymers, such as fluorinated polyimides, to determine if the polymers are possible substitutions for $SiO_2$ as an insulative material. Several of these polymers have dielectric constants that are considerably lower than the dielectric constant of $SiO_2$. However, as in the case with $SiO_2$, the polymers also exhibit incompatibility problems with copper metallurgy. It has been shown that polyimide, and many other polymers, react with copper during the curing process to form $CuO_2$, which is dispersed within the polymer. D. J. Godbey, L. J. Buckley, A. P. Purdy and A. W. Snow, "Copper Diffusion in Organic Polymer Resists and Inter-level Dielectrics," at the International Conference on Metallurgical Coatings and Thin Films, San Diego, Calif., Apr. 21–25, 1997, Abstract H2.04 p. 313 (hereinafter "Godbey"). $CuO_2$ is conductive, so its presence raises the effective dielectric constant of the polymer and, in many cases, also increases the conductivity of the polymer.

Andricacos notes that the use of a copper conductor along with the barrier layer provides a significant improvement in conductivity over the Ti/AlCu/Ti sandwich structure currently used in the industry. Andricacos also noted that as the line width decreases, even a thin barrier layer has a significant effect on the resistance of the composite line. The solutions proposed by Harper and Muraka attempted to address this problem by forming the barrier layer in situ by chemically reacting the insulative material and the copper alloy. The barrier layer is formed in the area that was previously the insulative material, leaving the conductor width and height unaffected. However, these processes also affect the resistivity of the conductor because the use of an aluminum alloy, even at a concentration so low as not to be completely effective, shows a measurable increase in resistance compared to that of an unalloyed copper line. While the process of Harper uses only one layer of the copper alloy, the one layer has a significantly high concentration of aluminum and, therefore, the final structure will have an increased resistivity.

As minimum dimensions shrink, the use of even a 20 Angstrom ("Å") layer of an alloy having a high resistivity will significantly affect the total resistivity of the conductor composite. For example, a 200 Å layer on both sides of a 0.1 μm trench is 40 percent of the total trench width. Therefore, at the same time that the dimensions of the conductor element decrease, the specific resistivity increases, which provides a high resistivity at the very time a conductor having a low resistivity is desired.

It has also been shown that there is a significant difference in the amount of copper oxide formed when a polyimide is used as the insulative material if the acidity of the polymer solution is low. The acidity of the polymer solution is typically low if the precursor used in the formation of the polyimide is an ester instead of an acid. As shown in Godbey, when PI-2701 is used, the amount of oxide formed is reduced by a factor of approximately four in comparison to films that use a similar chemistry but that are prepared from an acid precursor. PI-2701 is a photosensitive polyimide from E.I. du Pont de Nemours & Company (Wilmington, Del.) that starts from an ester precursor. It is thought that the slight acidity of PI-2701 comes from the photo-pac or the process used to form it. The films produced in Godbey were prepared by curing the liquid precursor in an air environment or a near, but not completely, inert environment. It is well known that the copper oxide will not form in, and is reduced by, a high purity hydrogen atmosphere.

Muraka discloses that the use of Ti as a barrier layer was found to increase the resistivity of the copper film significantly when heat-treated at temperatures of 350° C. or greater. If the heat treatment was carried out in hydrogen, no increase in resistivity was found. As this temperature is above the eutectoid temperature of a Ti-hydrogen system, the formation of TiH is assumed to have occurred. Muraka also indicates that a similar increase in resistivity is seen with Zr- and Hf-containing copper alloys. However, no data in support of this assertion is provided.

Other researchers have disputed Muraka's conclusions. Saarivirta, M. J., "High Conductivity Copper Rich Cu—Zr Alloys," Transactions of the Metallurgical Society of AIME, 218, p. 431–437, (1960) (hereinafter "Saarivirta"); U.S. Pat. No. 2,842,438 to Saarivirta et al. Equilibrium phase diagrams of Cu—Ti and Cu—Zr systems show that the solubility of Zr in copper is more than ten times less than that of Ti. Metals Handbook, v. 8, p. 300–2 ($8^{th}$ Ed.). It should also be noted that a series of Cu—Zr alloys have been disclosed that have good electrical conductivity.

Saarivirta shows that alloys containing more than about 0.01 weight percent of Zr have a significant loss of conductivity in an as-cast state. It has also been shown that the conductivity of a 0.23 weight percent Zr alloy is restored to above 90 percent of the international annealed copper standard for conductivity ("IACS") when the alloy, in the cold drawn state, is heat-treated above 500° C. for one hour. This indicates that a significant amount of the Zr, which was in solid solution in the as-cast state, has precipitated as pentacopper zirconium ("$Cu_5Zr$"). Therefore, it can be seen that if the Zr content in the copper is kept low, the conductivity of the resulting metallurgy is above 95 percent of IACS. If a Zr layer is deposited on top of a copper layer, the temperature of deposition of the Zr should be kept below 450° C., with a temperature of 250° C.–350° C. being preferable. This deposition typically occurs in a single damascene process or at the bottom of vias in a dual-damascene process. When the deposition temperature is kept in this range, a thin layer of $Cu_5Zr$ tends to form initially, thus inhibiting the diffusion of Zr into the copper. Even at 450° C., the solubility is low enough to provide very good conductivity. Although Zr and Ti have many similar properties, their solubility in copper differs by more than a factor of 10. Therefore, the use of Zr is preferred over Ti for this application.

Methods of forming barrier layers and seed layers by ion implantation are disclosed in U.S. Pat. Nos. 6,420,262 and 6,376,370, both to Farrar, incorporated in their entirety by reference herein. In U.S. Pat. No. 6,420,262, a transition metal, a representative metal, or a metalloid is deposited on an insulator using an ion implantation technique. An inhibiting layer or barrier layer is formed by a reaction between the transition metal, the representative metal, or the metalloid and the insulator. The barrier layer prevents copper from a metallization layer from diffusing into the insulator. In U.S. Pat. No. 6,376,370 a barrier layer and a seed layer are deposited using ion implantation. The barrier layer is formed by depositing Zr, Ti, or Hf by a low energy ion implantation. The seed layer is formed by depositing aluminum, copper, silver, or gold by a low energy ion implantation. Copper, gold, and silver have lower resistivities than aluminum and also have a significantly lower adhesion to oxides than aluminum. However, all of these materials have relatively poor adhesion to polymers.

The processes described above offer significant improvements to the barrier adhesion art for bottom and sidewalls of trenches of a damascene or dual damascene structure. While techniques for forming barrier layers that separate copper from the trenches in a damascene and/or dual damascene structure are known, few acceptable techniques exist for forming the barrier layer on a top surface of a metal in a damascene structure. The few processes that exist require considerable processing and process complexity. For instance, in U.S. Pat. No. 6,426,289 issued to Farrar, a thin layer of zirconium is deposited on a top surface of a copper metal layer to form a barrier layer. The zirconium is implanted into the copper using a low energy implantation technique. However, the process uses a sacrificial, multi-layer dielectric structure and selective etching to form the barrier layer and, therefore, requires modifications to the damascene process.

It would be desirable to provide a barrier layer for the top surface of a semiconductor device structure that does not require complex processing or modifications to current processes. To reduce processing complexity, it is desirable to form the barrier layer without using a mask to define the barrier layer.

BRIEF SUMMARY OF THE INVENTION

The present invention relates to a semiconductor device structure having a barrier layer to prevent the diffusion or penetration of metal. The semiconductor device structure comprises a semiconductor substrate, a dielectric layer, a metallization layer, and the barrier layer. The barrier layer may be a thin layer about 5 Å to about 40 Å thick formed over the dielectric layer and the metallization layer. The barrier layer may comprise a conductive portion formed from a metal nitride and a nonconductive portion formed from a metal oxide, metal oxynitride, metal carbide, or metal carbonitride. The conductive portion may be present over the metallization layer while the nonconductive portion may be present over the dielectric layer. The metal used in the barrier layer may be Ti, Zr, or Hf. The dielectric layer used in the semiconductor device structure may be an organic material, such as polyimide, or an oxide compound, such as $SiO_2$.

The present invention also relates to a method of forming a barrier layer on a surface of a semiconductor device structure. The method comprises providing a semiconductor substrate and forming a dielectric layer having at least one trench over the semiconductor substrate. A metallization layer is selectively deposited in the trench. A thin metal layer is formed over the metallization layer and the dielectric layer by low energy implantation. The metal layer may be a layer of Ti, Zr, or Hf and be about 5 Å to about 40 Å thick. The metal layer may be reacted in a nitrogen atmosphere to produce a barrier layer comprising a conductive portion and a nonconductive portion. The conductive portion of the barrier layer may overlie the metallization layer and the nonconductive portion may overlie the dielectric layer. The conductive portion may comprise a metal nitride and the nonconductive portion may comprise a metal oxide, metal oxynitride, metal carbide, or metal carbonitride.

BRIEF DESCRIPTION OF THE SEVERAL VIEWS OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE INVENTION

The semiconductor device structure of the present invention has a top barrier layer that prevents metal diffusion and contamination. In addition to the top barrier layer, the semiconductor device structure includes a semiconductor substrate, a dielectric or insulative layer, and a metallization layer. The term "top barrier layer" is used herein for convenience to refer to a barrier layer formed over the dielectric layer and the metallization layer. However, it is understood that the barrier layer is not necessarily the top, or uppermost, layer of the semiconductor device structure. Rather, additional layers may be formed over this barrier layer. The top barrier layer may include a conductive layer over the surface of the metallization layer and a nonconductive layer over the dielectric layer. While the top barrier layer prevents metal diffusion, it also provides the semiconductor device structure with a desired, low resistivity since a portion of the top barrier layer is conductive.

The methods and structures described herein do not form a complete process for manufacturing semiconductor device structures. The remainder of the process is known to those of ordinary skill in the art and, therefore, only the process steps and structures necessary to understand the present invention are described herein.

Figure 1:
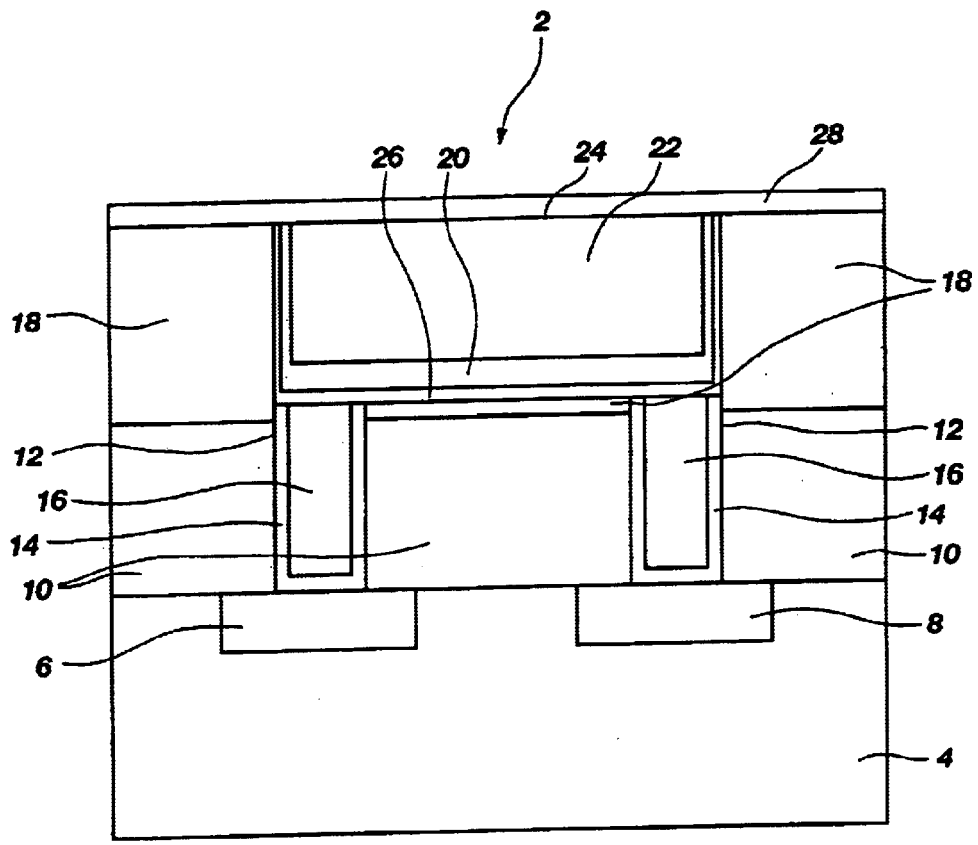
FIG. 1 is a schematic illustration of a cross-sectional view of a semiconductor device structure according to the present invention.

FIG. 1 shows a cross-sectional view of a semiconductor device structure 2 of the present invention. The semiconductor device structure 2 may include a semiconductor substrate 4 having a number of semiconductor devices 6,8. As used herein, the term "semiconductor substrate" includes a semiconductor wafer or other substrate comprising a layer of semiconductor material, such as a silicon wafer, a silicon on insulator ("SOI") substrate, a silicon on sapphire ("SOS") substrate, an epitaxial layer of silicon on a base semiconductor foundation, and other semiconductor materials such as silicon-germanium, germanium, gallium arsenide, and indium phosphide.

The semiconductor device structure 2 may optionally include a protective layer 10, which overlies the semiconductor substrate 4. The protective layer 10 prevents metal, such as copper, from contacting the semiconductor devices 6,8. The protective layer 10 may be formed from a silicon nitride compound, such as trisilicon tetranitride ("$Si_3N_4$"). The semiconductor structure 2 may also include contacts 12 that provide electrical connection to the semiconductor devices 6,8. These contacts 12 may include a first barrier layer (or seed layer) 14 and a metal plug 16. The first barrier layer 14 prevents metal from the metal plug 16 from diffusing into the semiconductor devices 6,8.

A dielectric layer 18 may also be present on the semiconductor device structure 2. The dielectric layer may be an inorganic or organic material having a low dielectric constant, such as an oxide compound, an aerogel, or apolymer. The oxide compound may be silicon dioxide ("$SiO_2$"). If the dielectric layer 18 is a polymer, the polymer may be an organic polymer that has 5 or more -mer units having carbon chain backbones, an organic oligomer having 2 to 4-mer units having carbon chain backbones, an organic monomer, or a material having similar properties to those of organic polymers. The polymer may be a polyimide, classes of which are known in the art and described in U.S. Pat. No. 6,077,792 to Farrar. The polymer may include, but is not limited to, a foamed polymer, a fluorinated polymer, and a fluorinated-foamed polymer. Exemplary polymers include, but are not limited to, a DuPont PI-2801 material, a foamed DuPont PI-2801 material, a fluorinated DuPont PI-2801 material, and a fluorinated-foamed DuPont PI-2801 material.

A seed layer 20 and a conductor layer 22, which form a portion of the metallization layer 24, may also be present on the semiconductor device structure 2. A second barrier layer 26 may be present below the seed layer 20 to separate the seed layer 20 and the conductor layer 22 from the dielectric layer 18. As shown in FIG. 1, the dielectric layer 18 may be adjacent to the metallization layer 24.

The top barrier layer 28 may be formed over a top surface of the dielectric layer 18 and the metallization layer 24. While the top barrier layer 28 is illustrated as a single layer, the top barrier layer 28 may, in actuality, include multiple portions. For instance, a portion of the top barrier layer 28 above the metallization layer may be conductive while a portion of the top barrier layer 28 above the dielectric layer 18 may be nonconductive.

Figure 2A:
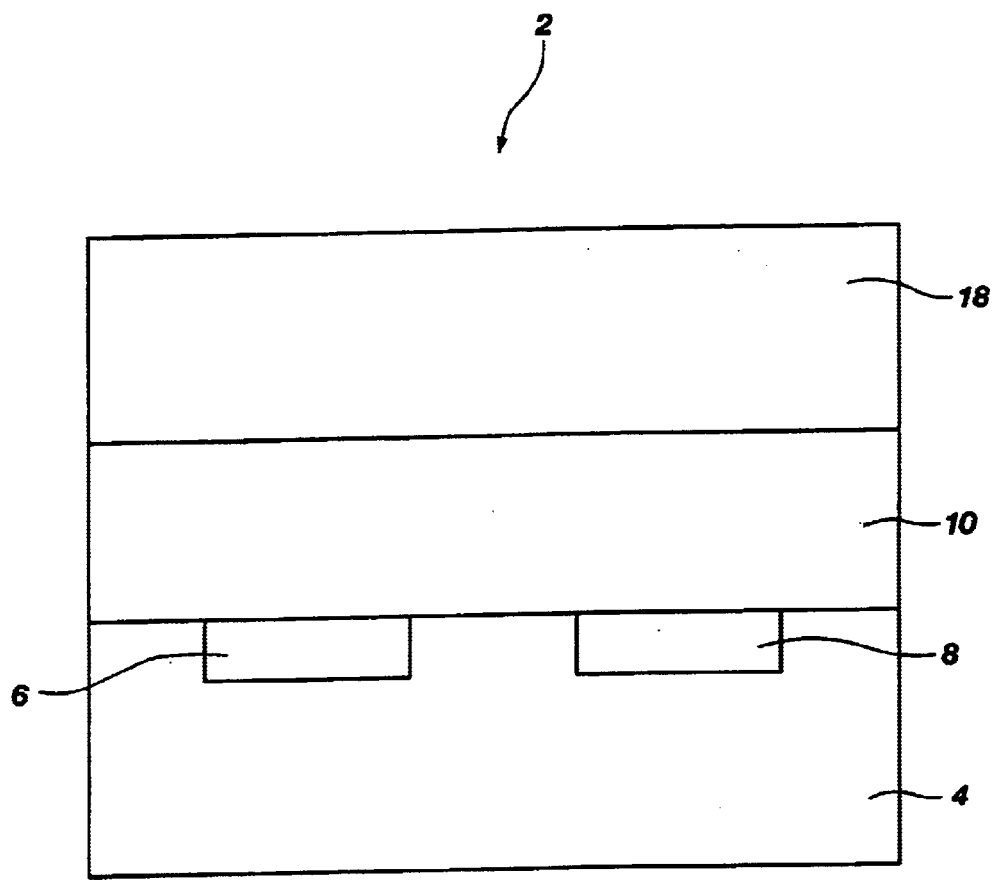
FIGS. 2A–2E are cross-sectional views of a semiconductor device structure during processing according to the present invention.

The top barrier layer 28 of the semiconductor device structure may be formed on a top surface of the semiconductor device structure 2. FIGS. 2A–2E show cross-sectional views of the semiconductor device structure 2 fabricated according the present invention. FIG. 2A illustrates a portion of the semiconductor device structure 2 having a number of semiconductor devices 6,8. The semiconductor devices 6,8 may be formed in the semiconductor substrate 4 and include active semiconductor devices 6, such as transistors, and passive semiconductor devices 8, such as capacitors, or a combination of active and passive semiconductor devices 6,8. The semiconductor device structure 2 optionally includes the protective layer 10, which is deposited over the semiconductor substrate 4 and semiconductor devices 6,8. The protective layer 10 may be formed from $Si_3N_4$ and deposited at a thickness of about 100 nm. The dielectric layer 18 may be deposited over the protective layer 10. However, it is also contemplated that the dielectric layer 18 may be formed before the protective layer 10 and, therefore, may be present under the protective layer 10. The thickness of the dielectric layer 18 may depend on the material that is used. For instance, if the dielectric layer 18 is formed from a polymer, the polymer may be deposited to a sufficient thickness to equal a desired thickness of a first wiring level when the polymer is cured. If the dielectric layer 18 is formed from $SiO_2$, $SiO_2$ may be deposited to a thickness that is equal to the desired thickness of the first wiring level.

Figure 2B:
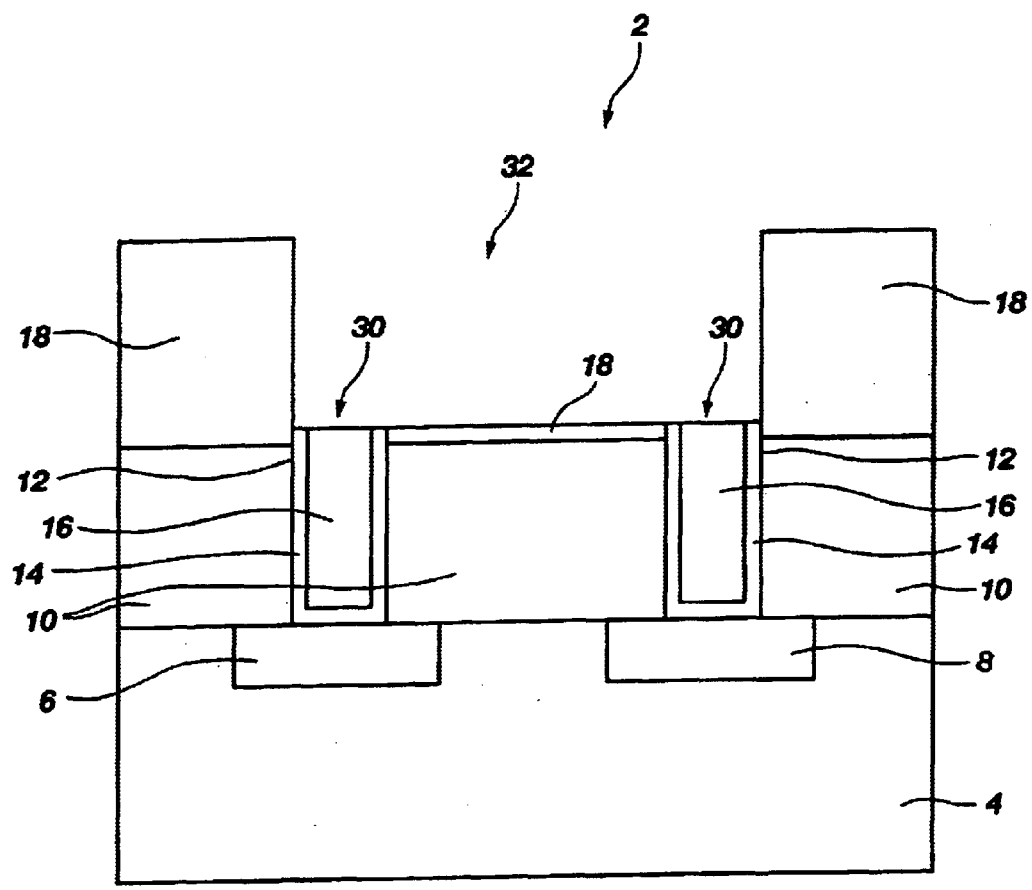

As shown in FIG. 2B, vias 30 may be opened to semiconductor devices 6,8 using photolithography techniques and etching processes. These photolithography techniques and etching processes are known in the art and may be selected for use in the present invention by a person of ordinary skill in the art. Therefore, the photolithography techniques and etching processes are not presented here in full. The contacts 12, which include the first barrier layer 14 and the metal plug 16, may be formed in the vias 30. The first barrier layer 14 may be deposited in the vias 30 by a suitable deposition technique, such as chemical vapor deposition ("CVD"). The first barrier layer (or seed layer) 14 may be formed from a conventional material, such as titanium silicide. The metal plug 16 may be deposited in the vias 30 by a suitable deposition technique, such as CVD. The metal plug 16 may be formed from a conventional material, such as W. Excess material from the first barrier layer 14 or the metal plug 16 may be removed from the surface of the dielectric layer 18 or the protective layer 10 by chemical mechanical planarization ("CMP") or other suitable processes to form a planarized surface.

The dielectric layer 18 may be patterned to define at least one trench 32. As used herein, the term "trench" includes lines for electrically interconnecting semiconductor devices 6,8 in the semiconductor device structure 2. The trench 32 may be formed in the dielectric layer 18 to open up the semiconductor device structure 2 to a number of first level vias, such as vias 30. To form the trench 32, a first level metallization layer pattern may be defined in a photoresist layer formed from a conventional photoresist material. Then, the dielectric layer 18 is etched, using a conventional process, so that the first level metallization layer pattern is defined in the dielectric layer 18. The etching process may include, but is not limited to, reactive ion etching ("RIE") or an oxide etch. The photoresist layer may subsequently be removed from the semiconductor device structure 2 by a conventional process, such as a wet-strip process, a dry-strip process, or combinations thereof. This process may also remove unwanted portions of the seed layer 20 and the second barrier layer 26, such as portions that are present outside the trench 32 along a top surface of the dielectric layer 18.

Figure 2C:
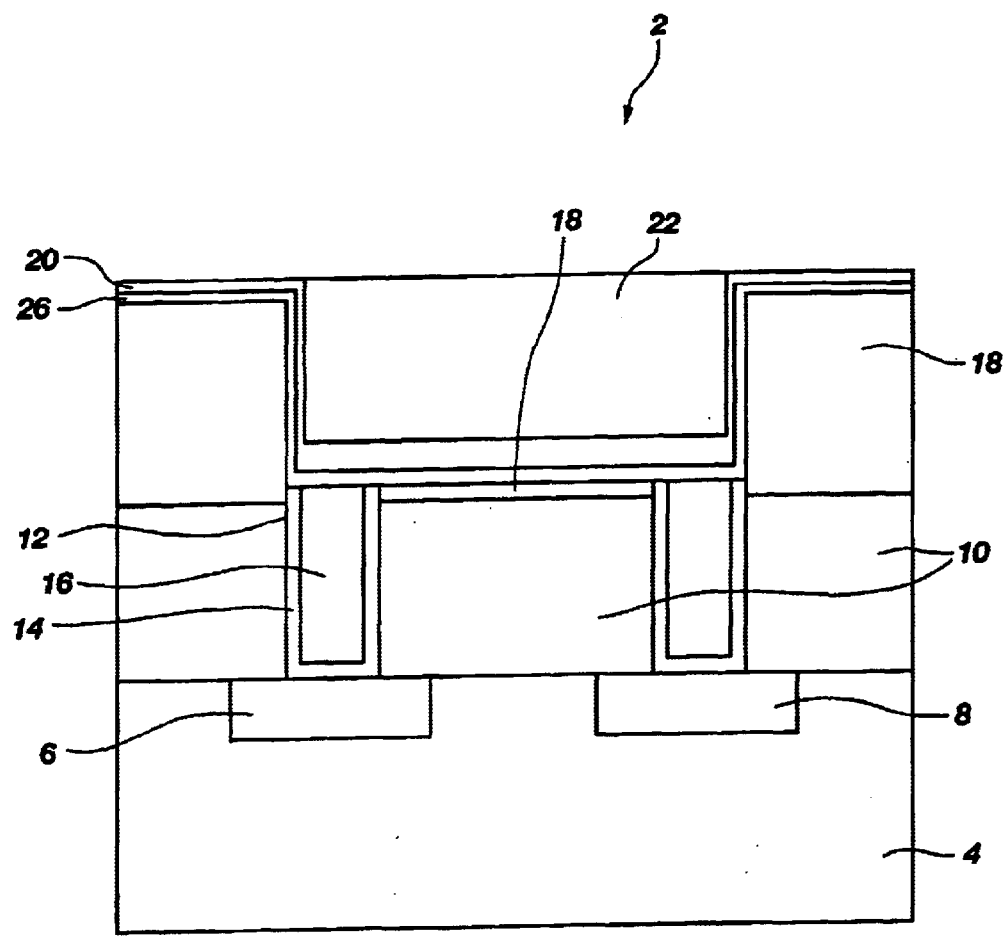

As shown in FIG. 2C, the second barrier layer 26 may be deposited on the bottom and sidewalls of the trench 32 and over the top surface of the dielectric layer 18 by conventional techniques, such as low-energy implantation or CVD. The second barrier layer 26 may be formed from tantalum or tantalum nitride. The seed layer 20 may then be deposited over the second barrier layer 26 using CVD, physical vapor deposition ("PVD"), or other methods known in the art. The seed layer 20 may function as a catalyst or a base metal for electroless plating or electroplating of the metallization layer 24. The metal used in the seed layer 20 may be selected depending on the metal to be deposited in metallization layer 24. For instance, if the metallization layer 24 is to be formed from copper, the seed layer 20 may be a copper seed layer. The seed layer 20 may have a thickness of about 100 Å.

The remainder of the trench 32 may be filled with a metal using electroless or electrolytic deposition to form the conductor layer 22, which in combination with the seed layer 20 forms the metallization layer 24. As described above, before the metal is deposited, the dielectric layer 18 may be etched to its final shape. For instance, if a dual damascene process is used, both a line structure and vias may be defined in a single, dielectric layer 18. The metal of the conductor layer 22 may include, but is not limited to, copper, copper alloys, silver, or silver alloys. The conductor layer 22 may be deposited by a selective CVD process, electroplating, or electroless plating. The resulting metallization layer 24 may have a thickness approximately equal to or slightly less than the thickness of the dielectric layer, depending on the material used in the dielectric layer 18. Excess metal may be removed from the metallization layer 24 by CMP.

Figure 2D:
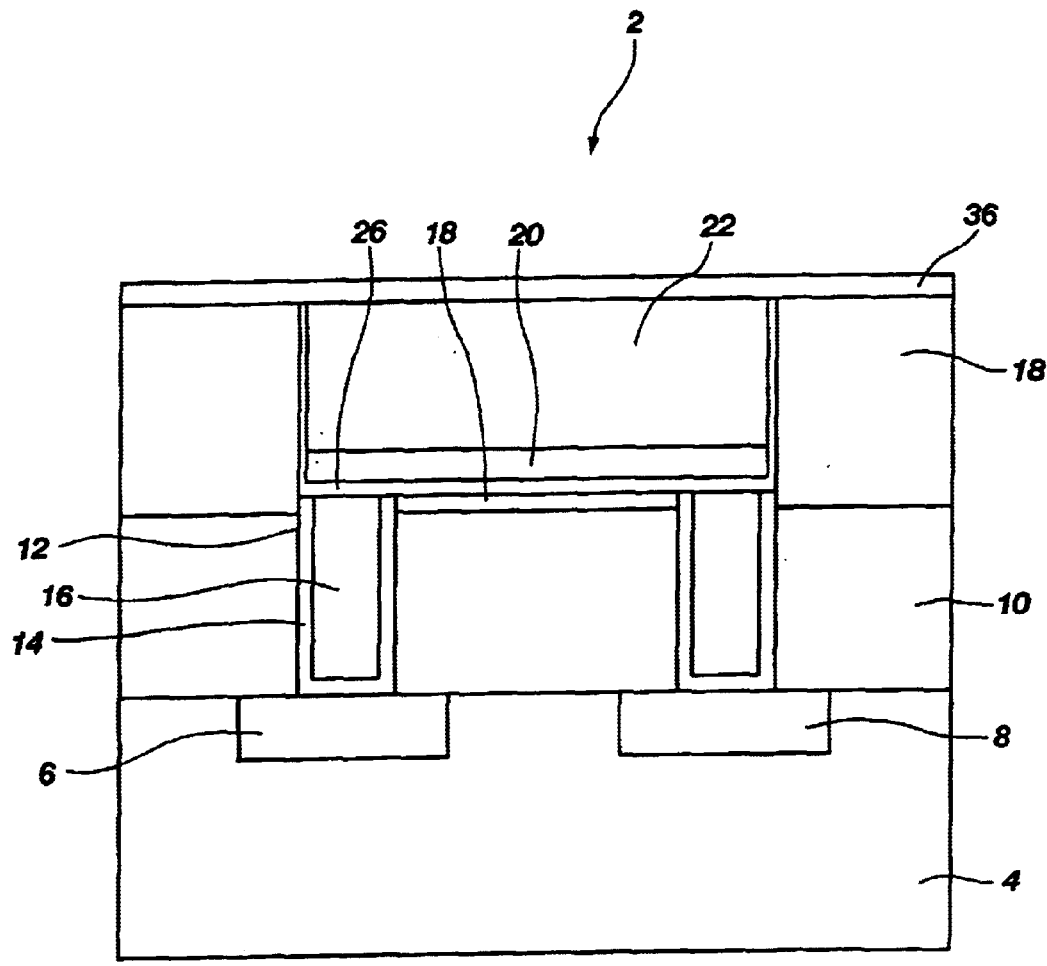

A thin, metal layer 36 may be deposited on the top surface of the metallization layer 24 and the dielectric layer 18, as shown in FIG. 2D. The metal layer 36 may be deposited at a temperature from about room temperature (approximately 25° C.) to about 250° C. The metal may be Ti, Zr, or Hf. To control a thickness of the metal layer 36, the layer may be deposited by a controllable, deposition technique, such as low energy implantation, CVD, or an evaporation technique, which enables the metal to be applied as a thin layer. For instance, the metal layer 36 may be deposited by low energy implantation. An implant energy used during the implantation may be selected so that the metal penetrates the top surface of the metallization layer 24 and the dielectric layer 18. The implant energy may be selected so that a majority of the deposited metal is present in the top few atomic layers of the metallization layer 24 and the dielectric layer 18. The implant energy necessary to penetrate these layers may be from about 0.1 keV to about 2.0 keV, depending on the metal that is to be deposited. To achieve the desired depth, a metal concentration ranging from about $1.25 \times 10^{16}$ ions/cm$^2$ to about $2.0 \times 10^{17}$ ions/cm$^2$ may be used, depending on the metal to be deposited. The metal may penetrate the metallization layer 24 and the dielectric layer 18 from about 5 Å to about 50 Å. In other words, the metal layer 36 may be from about 5 Å to about 50 Å thick. However, it is also understood that the metal may penetrate a different depth into each of the metallization layer 24 and the dielectric layer 18. For instance, the metal may penetrate deeper into the dielectric layer 18 than the metallization layer 24. In one embodiment, the metal layer 36 is from about 5 Å to about 40 Å thick. However, the thickness of the metal layer 36 may depend on the metal being used. For instance, a zirconium layer from about 10 Å to about 30 Å thick, or a hafnium layer from about 20 Å to about 30 Å thick, may be formed.

Figure 2E:
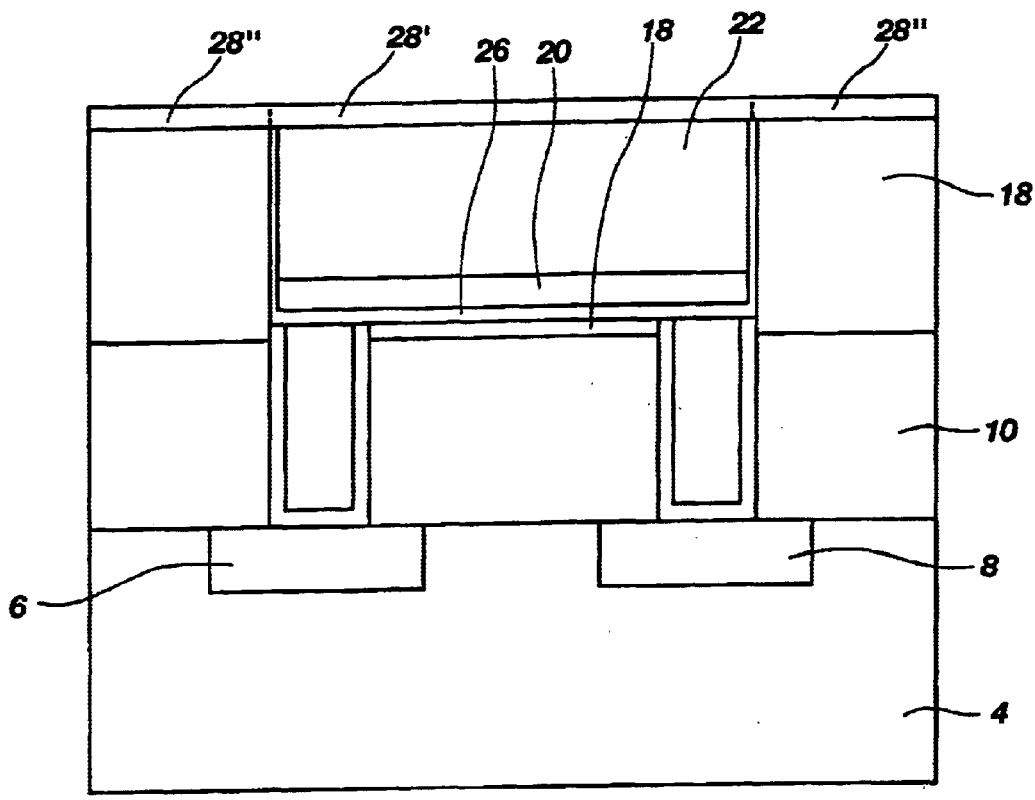

The metal layer 36 may be reacted to form the top barrier layer 28, which includes a conductive layer 28' and a nonconductive layer 28", as shown in FIG. 2E. The conductive layer 28' may be formed over the metallization layer 24 and the nonconductive layer 28" may be formed over the dielectric layer 18. The top barrier layer 28 may be formed by exposing the semiconductor device structure 2 to a nitrogen-containing environment at a temperature from about 250° C. to 450° C. The semiconductor device structure 2 may be exposed to nitrogen for an amount of time sufficient to incorporate nitrogen into portions of the metal layer 36 (FIG. 2D). The nitrogen-containing environment may include, but is not limited to, gases such as nitrogen ("$N_2$"), nitric oxide ("NO"), nitrous oxide ("$N_2O$"), or ammonia ("$NH_3$"). For sake of example only, the semiconductor device structure 2 may be exposed to a nitrogen plasma or an elevated temperature nitrogen treatment, such as a rapid thermal nitrogen treatment. The nitrogen plasma may be generated using a conventional plasma-generating method, such as a method that uses a direct current ("DC"), radiofrequency ("RF"), or microwave power source. The nitrogen plasma may be produced from a gas mixture that includes $N_2$, $NH_3$, or other nitrogen-containing gases. The semiconductor device structure 2 may be exposed to nitrogen at atmospheric pressure from approximately 0.5 hours to approximately three hours. Longer exposure times may be necessary if only a partial pressure of nitrogen is used.

To produce the conductive layer 28', portions of the metal layer 36 overlying the metallization layer 24 may react with the nitrogen to produce a conductive, metal nitride compound. For instance, if titanium is used in the metal layer 36, a titanium nitride layer is produced in those portions of the titanium layer overlying the metallization layer 24. At the same time, portions of the metal layer 36 overlying the dielectric layer 18 may react with the carbon or oxygen in the dielectric layer 18 to form the nonconductive layer 28". It is also contemplated that nitrogen may react with the dielectric layer 18 and the portions of the metal layer 36 overlying the dielectric layer 18. Therefore, the nonconductive layer 28" may be formed from a metal oxide, metal oxynitride, metal carbide, or metal carbonitride compound. For instance, if titanium is used as the metal layer 36, a layer of titanium oxide (TiO or $TiO_2$) or titanium oxynitride ("$TiO(N)_x$") may be formed over the dielectric layer 18 if that layer includes oxygen. A layer of titanium carbide ("TiC") or titanium carbonitride ("$TiC(N)_x$") may be formed over the dielectric layer 18 if that layer includes carbon. It is understood that the conductive layer 28' may be zirconium nitride or hafnium nitride and the nonconductive layer 28" may be an oxide, oxynitride, carbide, or carbonitride of zirconium or hafnium if Zr or Hf are deposited as the metal layer 36. The top barrier layer 28 may be about 5 Å to about 100 Å thick.

Since the nitrogen atmosphere only produces the conductive, metal nitride compound over the metallization layer 24, the conductive layer 28' may be selectively formed over metal regions of the semiconductor device structure 2 while the nonconductive layer 28" is formed over other regions of the semiconductor device structure 2. Since these portions of the top barrier layer 28 are conductive, a semiconductor device structure 2 having a low resistivity may be produced.

The process described above may be utilized to form a single damascene structure. A dual damascene structure may be constructed using appropriate masking steps known in the art. It is also contemplated that the process may be repeated to form a desired number of metallization layers in the semiconductor device structure 2.

The advantages of the present invention are numerous. First, the top barrier layer 28 prevents metal diffusion and metal penetration in the semiconductor device structure 2. Second, since the top barrier layer 28 is formed by depositing the metal layer 36 and reacting the metal layer 36 in a nitrogen atmosphere, a photomask may not be necessary to define the top barrier layer 28. By eliminating the photomask, the processing complexity of the semiconductor device structure 2 may be substantially reduced. In addition, the formation of the top barrier layer 28 requires no modifications to existing processes, such as a damascene process. Third, the top barrier layer 28 has minimal effect on the total resistivity of the semiconductor device structure 2 because the top barrier layer 28 has a minimal thickness. Fourth, the top barrier layer 28 includes conductive and nonconductive portions, which are selectively formed over the metallization layer 24 and the dielectric layer 18, respectively. Since portions of the top barrier layer 28 are conductive, the semiconductor device structure 2 has the desired, low resistivity.

In one embodiment of the present invention, a semiconductor device structure 2 using copper metallurgy in its entire wiring pattern is formed. A layer of about 100 nm of $Si_3N_4$ is, optionally, deposited over the semiconductor substrate 4 and semiconductor devices 6,8 to form the protective layer 10. The dielectric layer 18, formed from polyimide, is then deposited over the protective layer 10 and cured. The polyimide layer is of sufficient thickness so that its thickness equals the first contact and wiring level of the semiconductor device structure 2 when the polyimide is cured. Contacts 12 are then opened through the polyimide layer and the protective layer. TiN is deposited to form the first barrier layer 14 and W is deposited to form the metal plug 16. Excess W and TiN are subsequently removed from the surface of the protective layer 10 or the polyimide layer by CMP.

A 500 Å thick layer of a low temperature oxide or a 500 Å thick layer of low temperature $Si_3N_4$ is then deposited, followed by a thin layer of photoresist. The desired damascene images are etched in the oxide or $Si_3N_4$ layer. An oxygen RIE process is used to transfer the desired damascene images into the polyimide layer to define trench 32. The oxygen RIE process also removes portions of the photoresist layer remaining after the damascene images are etched. The seed layer 20 appropriate for the electroless deposition of copper is then deposited. The remaining portions of the oxide or $Si_3N_4$ layer are then removed using an etchant that is selective for these layers but that has negligible effect on the polyimide layer. The etchant also removes the seed layer 20 from any locations outside the trench 32. A layer of copper is selectively electrolessly deposited to form the conductor layer 22. It is also contemplated that the copper layer is deposited by an electroplating process. If electroplating is used, a CMP process is used to remove unwanted copper from the surface of the polyimide layer. The copper layer is deposited in the trench 32 to the same thickness as the trench depth.

The top surfaces of the copper layer and the polyimide layer are implanted with Ti at 0.5 keV and at an implant dose of $5 \times 10^{16}$ ions/$cm^2$ to form thin, metal layer 36. The Ti penetrates the copper layer an average of about 10 Å and penetrates the polyimide layer about 30 Å. The Ti layer is then exposed to a nitrogen plasma at 350° C. for one hour. Portions of the Ti layer overlying the copper layer react with the nitrogen to form a TiN layer while portions of the Ti layer overlying the polyimide layer form a TiC or $TiC(N)_x$ layer. This process is repeated as necessary to build a multi-level, copper polyimide wiring structure having a desired number of layers. Depending on a temperature used to apply and cure the polyimide, as well as a temperature used to deposit the photoresist layer, a final post-processing heat treatment of 250° C.–350° C. for approximately 1 to 2 hours may be used to achieve the lowest resistivity conductors.

In another embodiment, the dielectric layer 18 is formed from $SiO_2$. A layer of approximately 100 nm of $Si_3N_4$ is, optionally, deposited over the semiconductor substrate 4 and semiconductor devices 6,8 to form the protective layer 10. In this embodiment, the dielectric layer 18, formed from $SiO_2$, is formed over the $Si_3N_4$ layer. Contacts 12 are then opened through the $SiO_2$ layer and the protective layer. TiN is deposited to form the first barrier layer 14 and W is deposited to form the metal plug 16. Excess W and TiN are subsequently removed from the surface of the protective layer 10 or the $SiO_2$ layer by CMP. An additional oxide layer is then applied having a thickness equal to the desired thickness of the first wiring level.

A 500 Å thick layer of low temperature $Si_3N_4$ is then deposited, followed by a thin layer of photoresist. The desired damascene images are etched in the $Si_3N_4$ layer and an oxide etch is used to transfer the desired damascene images into the $SiO_2$ layer to define trench 32. The seed layer 20 appropriate for the electroless deposition of copper is then deposited. The photoresist layer is then removed using a selective etchant having negligible effect on the $SiO_2$ layer. A copper layer is selectively electrolessly deposited to form the conductor layer 22. The thickness of the copper layer is slightly less than the thickness of the $SiO_2$ layer. In other words, the nominal copper thickness plus the deposition tolerance equals the thickness of the $SiO_2$ layer. The surface of the copper layer is then implanted with Ti at 0.5 keV. The Ti penetrates the copper layer an average of about 10 Å and penetrates the oxide layer about 20 Å. An implant dose of $5\times10^{16}$ ions per square cm is used. The Ti layer may be deposited by any other means desired. The Ti layer is exposed to a nitrogen plasma at 350° C. to form a TiN layer on the copper layer and a TiO, $TiO_2$, or TiO(N), layer on the $SiO_2$ layer.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope thereof as defined by the following appended claims.

What is claimed is:

1. A semiconductor device structure, comprising:
   a semiconductor substrate;
   a dielectric layer overlying a portion of the semiconductor substrate;
   a metallization layer adjacent to the dielectric layer; and
   a barrier layer overlying the metallization layer and the dielectric layer, the barrier layer comprising at least one conductive portion and at least one nonconductive portion.

2. The semiconductor device structure of claim 1, wherein the dielectric layer comprises an organic material or an inorganic material having a low dielectric constant.

3. The semiconductor device structure of claim 1, wherein the dielectric layer comprises an oxide compound, an aerogel, or a polymer.

4. The semiconductor device structure of claim 3, wherein the dielectric layer comprises a polymer selected from the group consisting of a foamed polymer, a fluorinated polymer, and a fluorinated-foamed polymer.

5. The semiconductor device structure of claim 3, wherein the dielectric layer comprises a polymer and the polymer is a polyimide.

6. The semiconductor device structure of claim 3, wherein the dielectric layer comprises an oxide compound and the oxide compound is silicon dioxide.

7. The semiconductor device structure of claim 1, wherein the metallization layer comprises copper or a copper alloy.

8. The semiconductor device structure of claim 1, wherein the metallization layer has a thickness approximately equal to or slightly less than a thickness of the dielectric layer.

9. The semiconductor device structure of claim 1, wherein the at least one conductive portion of the barrier layer overlies a portion of the metallization layer and the at least one nonconductive portion of the barrier layer overlies a portion of the dielectric layer.

10. The semiconductor device structure of claim 1, wherein the at least one conductive portion of the barrier layer comprises a metal nitride.

11. The semiconductor device structure of claim 10, wherein the at least one conductive portion of the barrier layer comprises titanium nitride, zirconium nitride, or hafnium nitride.

12. The semiconductor device structure of claim 1, wherein the at least one nonconductive portion of the barrier layer comprises an oxygen- or carbon-containing compound.

13. The semiconductor device structure of claim 12, wherein the at least one nonconductive portion of the barrier layer comprises a metal oxide, a metal oxynitride, a metal carbide, or a metal carbonitride.

14. The semiconductor device structure of claim 13, wherein the metal of the nonconductive portion of the barrier layer is titanium, zirconium, or hafnium.

15. The semiconductor device structure of claim 1, wherein the barrier layer has a thickness from about 5 Å to about 100 Å.

16. The semiconductor device structure of claim 1, wherein the barrier layer has a thickness from about 5 Å to about 40 Å.

17. The semiconductor device structure of claim 1, further comprising a protective layer between the semiconductor substrate and the dielectric layer.

18. A semiconductor device structure, comprising:
   a semiconductor substrate;
   a dielectric layer overlying a portion of the semiconductor substrate;
   a metallization layer adjacent to the dielectric layer; and
   a barrier layer overlying the metallization layer and the dielectric layer, the barrier layer comprising at least one conductive portion overlying the metallization layer and at least one nonconductive portion overlying the dielectric layer.

19. The semiconductor device structure of claim 18, wherein the dielectric layer comprises an oxide compound, an aerogel, or a polymer.

20. The semiconductor device structure of claim 19, wherein the dielectric layer comprises a polymer selected from the group consisting of a foamed polymer, a fluorinated polymer, and a fluorinated-foamed polymer.

21. The semiconductor device structure of claim 19, wherein the dielectric layer comprises a polymer and the polymer is a polyimide.

22. The semiconductor device structure of claim 19, wherein the dielectric layer comprises an oxide compound and the oxide compound is silicon dioxide.

23. The semiconductor device structure of claim 18, wherein the metallization layer comprises copper or a copper alloy.

24. The semiconductor device structure of claim 18, wherein the at least one conductive portion of the barrier layer comprises a metal nitride.

25. The semiconductor device structure of claim 24, wherein the at least one conductive portion of the barrier layer comprises titanium nitride, zirconium nitride, or hafnium nitride.

26. The semiconductor device structure of claim 18, wherein the at least by one nonconductive portion of the barrier layer comprises an oxygen- or carbon-containing compound.

27. The semiconductor device structure of claim 26, wherein the at least one nonconductive portion of the barrier layer comprises a metal oxide, a metal oxynitride, a metal carbide, or a metal carbonitride.

28. The semiconductor device structure of claim 18, wherein the barrier layer has a thickness from about 5 Å to about 40 Å.

29. A semiconductor device structure, comprising:
   a semiconductor substrate;
   a dielectric layer overlying a portion of the semiconductor substrate;
   a metallization layer adjacent the dielectric layer; and
   a barrier layer overlying the metallization layer and the dielectric layer, the barrier layer comprising at least one metal nitride portion overlying the metallization layer and at least one metal oxide, metal oxynitride, metal carbide, or metal carbonitride portion overlying the dielectric layer.

30. The semiconductor device structure of claim 29, wherein the dielectric layer comprises an oxide compound, an aerogel, or a polymer.

31. The semiconductor device structure of claim 30, wherein the polymer is selected from the group consisting of a foamed polymer, a fluorinated polymer, and a fluorinated-foamed polymer.

32. The semiconductor device structure of claim 30, wherein the polymer is a polyimide.

33. The semiconductor device structure of claim 30, wherein the oxide compound is silicon dioxide.

34. The semiconductor device structure of claim 29, wherein the metallization layer comprises copper or a copper alloy.

35. The semiconductor device structure of claim 29, wherein the at least one metal nitride portion of the barrier layer comprises titanium nitride, zirconium nitride, or hafnium nitride.

36. The semiconductor device structure of claim 35, wherein the at least one metal oxide, metal oxynitride, metal carbide, or metal carbonitride portion of the barrier layer comprises a chemical compound selected from the group consisting of titanium oxide, titanium oxynitride, titanium carbide, titanium carbonitride, zirconium oxide, zirconium oxynitride, zirconium carbide, zirconium carbonitride, hafnium oxide, hafnium oxynitride, hafnium carbide, and hafnium carbonitride.

37. The semiconductor device structure of claim 29, wherein the barrier layer has a thickness from about 5 Å to about 40 Å.

* * * * *